(12) United States Patent
Rao et al.

(10) Patent No.: US 6,864,306 B2
(45) Date of Patent: Mar. 8, 2005

(54) HIGH DIELECTRIC POLYMER COMPOSITES AND METHODS OF PREPARATION THEREOF

(75) Inventors: Yang Rao, Norcross, GA (US); Ching-Ping Wong, Berkeley Lake, GA (US); Jianwen Xu, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 266 days.

(21) Appl. No.: 10/135,744

(22) Filed: Apr. 30, 2002

(65) Prior Publication Data

US 2003/0006402 A1 Jan. 9, 2003

Related U.S. Application Data

(60) Provisional application No. 60/316,223, filed on Aug. 30, 2001, and provisional application No. 60/287,635, filed on Apr. 30, 2001.

(51) Int. Cl.$^7$ .............................. C08J 3/00; C08K 5/04; C08K 5/09; C08L 75/00; C08L 83/00
(52) U.S. Cl. ....................... 524/394; 524/397; 524/403; 528/92; 528/411
(58) Field of Search ................................. 524/394, 397, 524/403, 588, 590; 528/92, 411

(56) References Cited

U.S. PATENT DOCUMENTS 6,544,651 B2 * 4/2003 Wong et al.

OTHER PUBLICATIONS

Yang Rao and C.P. Wong; Material Characterization of High Dialectric Constant Polymer–Ceramic Composite for Embedded Capacitor to RF Application; 2002; Active Passive Eleactronic Compont v 25 n 1 2002; p. 123–129.

Yang Rao, C.P. Wong, and Jianmin Qu; Effective Dielectric Constant Prediction of Polymer–ceramic Composite Based on Self–consistent Theory; Dec. 2000; IEEE Transaction Compont Packaging Technology v 23 n 4 Dec. 2000; IEEE Piscataway NJ USA; p. 680–683.

Yang Rao and C.P. Wong; Ultra High Dielectric Constant Epoxy Silver Composite for Embedded Capacitor Application; Submitted to Applied Polymer Science; p. 1–6.

Yang Rao and C.P. Wong; Novel Ultra–high Dielectric Constant Polymer Based Composite for Embedded Capacitor Application; Jun., 2002; Proceeding of ECTC, San Diego, CA; p. 196–200.

Yang Rao and C.P. Wong; Ultra High Dielectric Constant Epoxy Silver Composite for Embedded Capacitor Application; Jun., 2002; Proceeding of POLYTRONIC; p. 920–923.

Patent Application filed May 18, 2001, assigned Ser. No. 09/860,856 and published under No. US 2002/0016396A1 for inventor Wong, et al., entitled High Dielectric Constant Nan0–Structure Polymer–Ceremic Composite.

* cited by examiner

Primary Examiner—Patrick D. Niland
(74) Attorney, Agent, or Firm—Thomas, Kayden, Horstemeyer & Risley, LLP

(57) ABSTRACT

Polymer composites and methods of making the polymer composites are presented. A representative polymer composite includes a polymer resin and a conductive material, wherein the polymer composite is characterized by a dielectric constant greater the 200. A representative method of making the polymer composite can be broadly summarized by the following steps: providing a polymer resin and a conductive material; mixing the polymer resin and the conductive material; and forming the polymer composite, wherein the polymer composite is characterized by a dielectric constant greater than 200.

27 Claims, No Drawings

HIGH DIELECTRIC POLYMER COMPOSITES AND METHODS OF PREPARATION THEREOF

CROSS-REFERENCE TO RELATED APPLICATION

This application claims priority to copending U.S. Provisional Application entitled "Ultra High Dielectric Constant Epoxy-Metal Composite Based on Percolation Theory," filed with the USPTO on Aug. 30, 2001, and assigned Ser. No. 60/316,226, and U.S. Provisional Application entitled, "Ultra High Dielectric Constant Epoxy-Metal Composite Based on Percolation Theory," filed with the USPTO on Apr. 30, 2001, and assigned Ser. No. 60/287,635, which are both entirely incorporated herein by reference.

TECHNICAL FIELD

The present invention is generally related to polymer composites and, more particularly, is related to high dielectric constant polymer composites and methods of preparation thereof.

BACKGROUND

The evolution of electronic packaging can be categorized into three generations. The first generation of the electronic packages is called the discrete board package, which used discrete passive components that took more than 80% of the board area to fulfill the supporting function to the integrated circuit (IC). The second generation of electronic packages used technologies such as chip scale packaging (CSP) and multi-chip-module (MCM) to increase the IC efficiency to 30–40%. The third generation of electronic packages, system on a package (SOP), proposed by the Packaging Research Center of Georgia Tech, will be based on a single-level integrated module (SLIM) technology. SLIM employs a low-cost large-area organic substrate on which consists a multiple-level structure capable of providing power, ground, and controlled impedance interconnection functions, together with a full range of integral passives.

Incorporation of passives, RF, and optical component functionalities on-chip as in the System-on-Chip (SOC) approach is an ideal way of achieving very high packaging efficiency. However, there are a number of barriers in the implementation of such an approach. First, next generation broadband communications require a combination of technologies like silicon (Si) and gallium arsenide (GaAs), and incorporating them on a single chip is very difficult. Second, added functionality on to the chip increases the number of fabrication steps, thus lowering the yield and greatly increasing the cost of SOC. Third, the product design cycle of SOC can be extended as each product will be highly application specific and require a complete redesign to incorporate new functions or modify existing ones.

The alternate SOP approach to miniaturization has a potential to achieve a high level of integration with lower projected costs, similar performance benefits, a high degree of design flexibility, and very low projected time to market. Thus, when further integration on chip becomes cost preventive, functional elements may be integrated into the package in the SOP fashion. The SOP approach may be the best solution to meet the requirements of the next generation digital consumer, telecommunication, and automotive electronics. For example, more than 70% of the area of printed wiring boards (PWB) of a typical electronic product is occupied by passive components. Therefore, integration of passive components inside the substrate, i.e., embedded passives, is one of the key features of SOP.

The fundamental building blocks for all electronic systems are active and passive components and the interconnecting substrate. An active component is one that can control current or voltage. Active components such as transistors and ICs are used for amplification, rectification, or to switch or change energy from one form to another. A passive component does not generate voltage or current. Components such as capacitors, resistors, and inductors are passive components. Their electrical characteristics are needed to form a complete circuit with voltage and current sources and active components in electronic equipment.

Passive components can be implemented in any of the following ways: (1) Discrete: a single purpose passive component is enclosed in a single case that must be mounted to an interconnecting substrate (or board); (2) Integrated: multiple passive components are integrated within a single package or module; (3) Integral: functional passive components are formed on a layer within the interconnecting substrate; and (4) On-Chip: functional passive components are a part of the active silicon IC die itself.

Currently, the majority of passive components are employed in electronic systems as discrete components. Small discrete components dominate the PWB design in a typical hand held electronic product, such as a camcorder, which today may consist of only about 20 ICs compared to 300–400 passive components. Thus, the influence that passive components have on system cost, size, and reliability is substantial. In order to meet the goals of next generation electronic packaging (e.g., smaller, lighter, faster, cheaper, and more reliable products), alternatives to discrete passive components are necessary. Integral passive (IP) components are a developing technology that provides such an alternative.

Integral passive components offer many advantages over discrete components. Discrete mounting requires large board area and can introduce additional parasitic into the system, which may limit system performance. With integral passive components, the size of the board can be reduced, especially if chips can be placed above the embedded passive component. Also, embedding these components leaves free board space for mounting components that cannot be made integral. The parasitic associated with passive components are reduced because solder joints may be eliminated and shorter connections between passive components and other IC chips are possible; hence, improved electrical performance.

In the area of high performance products, discrete passive components used for functions such as bus decoupling, line termination, and initialization are speed limiting factors because of their size, configuration, and distance from the active circuit they serve. Capacitors and resistors integral to the PWB have the potential for removing speed and/or time barriers, because they can be placed much closer to the active circuit. Integral passive components can also provide reduced assembly costs, improved packaging efficiency, mass production by batch fabrication, small size, and light weight.

Discrete capacitors are used more than any other type of passive component, thereby making them integral would be advantageous. At present, there is no material suitable for replacing individual high value (>10 $nF/cm^2$) capacitors. Due to higher frequency applications, capacitance density requirements will increase over time. It has been suggested that, by the year 2004, technology may require capacitance density values of about 100 nF/cm$^2$ and dielectric constant values of 200. Consequently, material development is helpful to achieving integral capacitors that can accommodate future technology requirements.

Traditionally, material development efforts have focused on polymer-ceramic composite materials for embedded capacitor applications. However, there are some disadvantages using polymer-ceramic composite materials in the SOP substrate. First, polymer-ceramic composite materials having high ceramic loading have very poor adhesion. For example, the polymer-ceramic composite with dielectric constant equal to 150 has ceramic loading density as high as 85% by volume, which is about 98% by weight. At such high ceramic concentrations, the polymer-ceramic composite material has minimal adhesion. Although the adhesion of the polymer-ceramic composite increases when ceramic loading is reduced, the dielectric constant also decreases, which makes it very difficult to accommodate future technology requirements.

Thus, a heretofore unaddressed need exists in the industry to address at least the aforementioned deficiencies and/or inadequacies.

SUMMARY OF THE INVENTION

Embodiments of the present invention provide for polymer composites and methods of making the polymer composites. A representative embodiment of the polymer composite includes a polymer resin and a conductive material, wherein the polymer composite is characterized by a dielectric constant greater than 200.

Embodiments of the present invention can also be viewed as providing methods for making polymer composites. In this regard, one embodiment of such a method, among others, can be broadly summarized by the following steps: providing a polymer resin and a conductive material; mixing the polymer resin and the conductive material; and forming the polymer composite, wherein the polymer composite is characterized by a dielectric constant greater than 200.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

DETAILED DESCRIPTION

Embodiments of the present invention provide for polymer composites and methods of preparation thereof. Embodiments of the polymer composite can exhibit very high dielectric constants and low loss factors, while also exhibiting sufficient adhesion properties. Therefore, embodiments of the polymer composite may exhibit characteristics that overcome at least some of the disadvantages associated with polymer-ceramic composite materials.

Embodiments of the polymer composite can be fabricated into electronic devices such as integral and discrete passives (e.g., capacitors). In addition, embodiments of the polymer composite can be incorporated into circuit board substrates. For example, polymer composites can be incorporated into circuit boards such as silicon, ceramic, and organic circuit boards. The polymer composite can be incorporated into circuit boards as one or more integral components (e.g., as a capacitor). Also, polymer composites can be used to construct discrete passives mounted on the circuit board. In this regard, polymer composites can be incorporated into consumer and commercial electronics.

As indicated above, the polymer composite can have characteristics that overcome at least some of the disadvantages of the polymer-ceramic composite materials. These characteristics include the dielectric constant and the loss factor, for example. In this regard, the polymer composite can have dielectric constants greater than 100. In particular, the dielectric constant can range from about 100 to about 2500, from about 200 to about 2200, from about 500 to about 2200, and from about 1000 to about 2200. In addition, the polymer composite can have a loss factor less than 0.3. In particular, the loss factor can range from about 0.015 to about 0.24, from about 0.017 to about 0.24, and from about 0.019 to about 0.24. The polymer composites also have high breakdown voltages, which can range from about 1 MV/m to 5 MV/m. The moisture absorption of the polymer composites can range from about 1.1% to about 1.6%.

In general, embodiments of the polymer composite can include one or more conductive materials and one or more polymer resins. In addition, the polymer composite can include one or more materials, such as hardeners, catalysts, adhesion promoters, diluents, and/or ceramic fillers.

The conductive material can include materials such as, for example, transition metals, alloys of transition metals, carbon black, carbon fiber, and graphite. The transition metals can include, but are not limited to, nickel, copper, aluminum, palladium, silver, gold, platinum, tin, lead, combinations of these transition metals, and alloys of these transition metals. The conductive materials can have particle sizes in the range of about 0.5 micrometers to about 50 micrometers, and preferably in the range of about 1 micrometer to about 10 micrometers. In addition, the amount of conductive material that can be incorporated into the polymer composite can range from about 5 to about 50 volume percent of the polymer composite. The preferred conductive material is silver, where the particle sizes can range from about 0.1 micrometers to about 10 micrometers and the volume percent can range from about 1 to about 40 volume percent of the polymer composite.

The polymer resin can include, for example, a thermoplastic polymer or a thermosetting polymer. The thermoplastic polymers can include, for example, high-density polyethylene, liquid crystal polymers, and high glass transition temperature ($T_g$) thermoplastics. The thermosetting polymer can include, for example, epoxies, polyimide, siliconepolyimides, silicones, polyurethanes, and benzocyclobutenes. In addition, the thermosetting polymers can include epoxies such as, but not limited to, bisphenol A, bisphenol F, cycloaliphatic, biphenyl, naphthalene, novolac, and combinations thereof. The amount of polymer resin that can be incorporated into the polymer composite can range from about 1 to about 50 volume percent of the polymer composite.

The hardener can include compounds such as, for example, amines (e.g., tertiary amines aliphatic amines, and aromatic amines), anhydrides (e.g., carboxylic acid anhydrides), thiols, alcohols, phenols, isocyanates, boron complexes, inorganic acids, hydrazides, and imidazoles. In addition, the hardener can include derivatives of the compounds listed above for the hardener. The amount of hardener that can be incorporated into the polymer composite can range from about 1 to about 50 volume percent of the polymer composite.

The catalyst can include compounds such as, for example, imidazoles, metal chelates, amines (e.g., tertiary amines), ureas, and combinations thereof. The amount of catalyst that can be incorporated into the polymer composite can range from about 0 and about 10 volume percent of the polymer composite and the preferred amount of catalyst is about 0 to about 2 volume percent of the polymer composite.

The diluent can include compounds such as, for example, glycidyl ethers. The amount of catalyst that can be incorporated into the polymer composite can range from about 0 to about 50 volume percent of the polymer composite.

The adhesion promoter can include compounds such as, for example, silanes, silane coupling agents, and titanate coupling agents. The amount of adhesion promoter that can be incorporated into the polymer composite can range from about 0 to about 10 volume percent of the polymer composite and the preferred amount of adhesion promoter is about 0.1 to about 2 volume percent of the polymer composite.

The ceramic filler can include compounds such as, for example, nano-scale ceramic particles (e.g., silicone polycarbonate urethane), silica, doped silica, titanate, barium titanate, doped barium titanate, lead magnesium niobate, lead titanate, other high dielectric constant ceramics, metal acetylacytonate, metal thiocyanamines, and other high dielectric constant polymers. The amount of ceramic filler that can be incorporated into the polymer composite can range from about 0 to about 10 volume percent of the polymer composite.

The polymer composite can be prepared using conventional resin/paste mixing/blending equipment. The polymer composite can be optionally prepared utilizing a conventional three-roll mill (e.g., at least three times), ball mixer (e.g., ball milling at 220 rpm for at least 24 hours), high shear mixer (e.g., high speed blending for 20 minutes), and/or by hand mix. In general, the polymer resin, hardener, adhesion promoter, and/or the catalyst are first blended and the resulting composition blend is combined with the conductive material by hand mixing. Thereafter the resulting polymer composite is thoroughly mixed and cured.

Now having discussed the polymer composite, conductive materials, polymer resins, hardeners, catalysts, adhesion promoters, diluents, and ceramic fillers in detail, a discussion about percolation theory follows.

In general, embodiments of the present invention can be described in relation to the percolation theory, particularly percolation threshold. The percolation theory is a theory that describes disordered systems. The disorder can be defined by a random variation in degree of connectivity of sub-units of the system. Assume "p" is a parameter that defines the average degree of connectivity between various sub-units of some arbitrary system. For example, "p" may be defined as the connectivity of conductor regions in a mixture of insulator and conductor regions that are within a lattice system. At low "p" values, the mixture is an insulator, since a conducting path connecting opposite edges of the lattice does not exist. At large "p" values, many conduction paths between opposite edges exist so that electrical current can flow, and the mixture is a conductor. At some concentration in between, a threshold concentration "$p_c$" exists where for the first time electrical current can percolate from one edge to the other. Therefore, an insulator exists below "$p_c$" and a conductor exists above "$p_c$". The threshold concentration is called the percolation threshold of the system.

The embodiments of the present invention can be described in relation to the percolation threshold because the characteristics (e.g., dielectric constant and loss factor) of the polymer composite depend upon multiple variables such as the conductive material, particle size of the conductive material, polymer resin, etc. In this regard, the conductive materials, the particle size of the conductive material, the polymer resins, the hardeners, the catalysts, the adhesion promoters, the diluents, and the ceramic fillers can be adjusted to maximize one or more polymer composite characteristics. For example, when the volume percent of the conductive material in the polymer composite is close to the percolation threshold of the polymer composite, large conductive material clusters form, but conductive percolation clusters do not form. In other words, the volume percent of the conductive material in the polymer composites can be increased up to but not exceeding the percolation threshold of the polymer composite (i.e., a certain volume percent of the conductive material). Conductive percolation clusters form at volume percents beyond the percolation threshold, which decreases the dielectric constant of the polymer composite.

Therefore, embodiments of the polymer composite can include conductive materials having a volume percent of less than the volume percent that correlates to the percolation threshold. As shown in Examples 1–5 below, one method of determining percolation thresholds for polymer composites is by varying the volume percents of the conductive material, while keeping the other components of the polymer composite constant. In this manner, the transition from insulator to conductor can be substantially determined, which indicates the percolation threshold for the polymer composite. Thus, polymer composites can be fabricated having the conductive material at a volume percent that can maximize one or more polymer composite characteristic.

Having described the polymer composite in general, examples 1–5 will describe potential embodiments of the present invention. While embodiments of the polymer composites are described in connection with examples 1–5 and the corresponding text and tables, there is no intent to limit embodiments of the polymer composite to these descriptions. On the contrary, the intent is to cover all alternatives, modifications, and equivalents included within the spirit and scope of embodiments of the present invention.

In particular, examples 1–4 described below are illustrative examples of polymer composites having combinations of one or more of the components listed above. As will be seen in examples 1–4, polymer composites having specific characteristics can be fabricated by varying the conductive material, the particle size of the conductive material, and the polymer resin. However, it should be noted the type and/or amount of conductive material, polymer resin, hardener, catalyst, adhesion promoter, diluents, and/or ceramic filler can be adjusted to fabricate additional polymer composites which are intended to be included within the scope of embodiments of the present invention.

EXAMPLE 1

Table 1 illustrates the dielectric constant and loss factor of an exemplary embodiment of the polymer composite. The polymer composite includes a silver conductive material having a particle diameter distribution of about 5–15 micrometers. The polymer composite includes a rubber-modified epoxy resin (Epon™ 58034) as the polymer resin, which is manufactured by and commercially available from the Shell Chemical Company. The polymer composite includes methylhexahydrophthalic anhydride (MHHPA) as the hardener, which is manufactured by and commercially available from the Aldrich Chemical Company. The polymer composite includes 2-ethyl-4-methylimidazole (2E4MZ-CN) as the catalyst, which is manufactured by and commercially available from Shikoku Ltd. The polymer composite includes silicone polycarbonate urethane as the ceramic filler, which is manufactured by and commercially available from The Polymer Technology Group.

Initially, the catalyst, 2-ethyl-4-methylimidazole, is mixed with MHHPA and then the rubber-modified epoxy resin is added to the mixture. Subsequently, the ceramic filler is added to the mixture. Thereafter, the silver particles are added to the mixture and thoroughly mixed until a homogeneous mixture is formed. Then the homogeneous mixture is cured.

The rubber-modified epoxy resin and MHHPA are kept at a mixture ratio of about 1:0.85, respectively. The catalyst, 2-ethyl-4-methylimidazole, is kept between a level of about 0.1 to 1 parts per hundred parts of the total mixture. The ceramic filler is included in about 1 to about 15 volume percent of the polymer composite.

As shown in Table 1, the silver particle volume percent is varied between about 7.38% and 21% and specifically at the following volume percentages: 7.38%, 8.7%, 9.61%, 11.03%, 11.13%, 11.23%, 11.28%, 11.43%, 11.52%, 11.77%, 12.02%, 14.66%, and 20.69%. Table 1 lists the dielectric constant and loss factor of the polymer composite for each of the silver volume percentages listed above. The volume percents are selected to determine the approximate percolation threshold of this polymer composite. The polymer composite having a silver volume percentage of 11.23 achieves a dielectric constant of 1000 while maintaining a loss factor of 0.019 (e.g., near the percolation threshold for the polymer composite), which exceeds the anticipated requirements for 2004 technology. However, other polymer composites having different volume percents (i.e., a different dielectric constant and loss factor) may be used for other applications.

TABLE 1

| Silver Volume Percent | Dielectric Constant | Loss Factor |
| --- | --- | --- |
| 7.38 | 17 | 0.013 |
| 8.7 | 19 | 0.0134 |
| 9.61 | 35 | 0.014 |
| 11.03 | 200 | 0.015 |
| 11.13 | 500 | 0.017 |
| 11.23 | 1000 | 0.019 |
| 11.28 | 1500 | 0.15 |
| 11.43 | 2000 | 0.24 |
| 11.52 | 2000 | 5.33 |
| 11.77 | 2000 | 7.2 |
| 12.02 | 2000 | 8.4 |
| 14.66 | 2000 | 9.1 |
| 20.69 | 2000 | 10 |

EXAMPLE 2

Table 2 illustrates the dielectric constant and loss factor of an exemplary embodiment of the polymer composite. The polymer composite includes a silver conductive material having a particle diameter of about 1.5 micrometer. The polymer composite includes a photo-definable epoxy resin (Lam™ 58034) as the polymer resin, which can be purchased from the Shell Chemical Company. The polymer composite includes methylhexahydrophthalic anhydride (MHHPA) as the hardener. The polymer composite includes 2-ethyl-4-methylimidazole (2E4MZ-CN™) as the catalyst. The polymer composite includes silicone polycarbonate urethane as the ceramic filler.

Initially, the catalyst, 2-ethyl-4-methylimidazole, is mixed with MHHPA and then the photo-definable epoxy resin is added to the mixture. Subsequently, the ceramic filler is added to the mixture. Thereafter, the silver particles are added to the mixture and thoroughly mixed until a homogeneous mixture is formed. Then the homogeneous mixture is cured.

The photo-definable epoxy resin and MHHPA are kept at a mixture ratio of about 1:0.85, respectively. The catalyst, 2-ethyl-4-methylimidazole, is kept between a level of about 0.1 to 1 parts per hundred parts of the total mixture. The ceramic filler is included in about 1 to about 15 volume percent of the polymer composite.

As shown in Table 2, the silver particle volume percent is varied between about 11.5% and 14% and specifically at the following volume percents: 11.5%, 12.0%, 12.2%, 12.5%, 12.8%, 13.0%, 13.2%, 13.5%, and 14.0%. The volume percents are selected to determine the approximate percolation threshold of this polymer composite. Table 2 lists the dielectric constant and loss factor of the polymer composite for each of the silver particle volume percents listed above. A polymer composite having a silver volume percent of 12.8 (e.g., near the percolation threshold for the polymer composite) achieves a dielectric constant of 2500 and a loss factor of 0.042, which exceeds the anticipated requirements for 2004 technology. However, other polymer composites having different volume percents (i.e., a different dielectric constant and loss factor) may be appropriate for other applications.

TABLE 2

| Silver Volume Percent | Dielectric Constant | Loss Factor |
| --- | --- | --- |
| 11.5 | 35 | 0.014 |
| 12 | 200 | 0.015 |
| 12.2 | 1300 | 0.017 |
| 12.5 | 2200 | 0.021 |
| 12.8 | 2500 | 0.042 |
| 13 | 2800 | 0.24 |
| 13.2 | 4 | 5.33 |
| 13.5 | 3.8 | 7.2 |
| 14 | 4 | 8.2 |

EXAMPLE 3

Table 3 illustrates the dielectric constant and loss factor of an exemplary embodiment of the polymer composite. The polymer composite includes a gold conductive material having a particle diameter of about 10 micrometers. The polymer composite includes rubber-modified epoxy resin (Epon™ 58034) as the polymer resin.

The polymer composite includes methylhexahydrophthalic anhydride (MHHPA) as the hardener. The polymer composite includes 2-ethyl-4-methylimidazole (2E4MZ-CN) as the catalyst. The polymer composite includes silicone polycarbonate urethane as the ceramic filler.

Initially, the catalyst, 2-ethyl-4-methylimidazole, is mixed with MHHPA and then the photo-definable epoxy resin is added to the mixture. Subsequently, the ceramic filler is added to the mixture. Thereafter, the gold particles are added to the mixture and thoroughly mixed until a homogeneous mixture is formed. Then the homogeneous mixture is cured.

The photo-definable epoxy resin and MHHPA are kept at a mixture ratio of about 1:0.85, respectively. The catalyst, 2-ethyl-4-methylimidazole, is kept between a level of about 0.1 to 1 parts per hundred parts of the total mixture. The ceramic filler is included in about 1 to about 15 volume percent of the polymer composite.

As shown in Table 3, the gold particle volume percent is varied between about 10.5% and 13.5% and specifically at the following volume percents: 10.5%, 11.0%, 11.5%, 11.8%, 12%, 12.2%, 12.3%, 13%, and 13.5%. The volume percents are selected to determine the approximate percolation threshold of this polymer composite. Table 3 lists the dielectric constant and loss factor of the polymer composite for each of the gold particle volume percents listed above. A polymer composite having a gold volume percent of 12 (e.g., near the percolation threshold for the polymer composite) achieves a dielectric constant of 1600 and a loss factor of 0.042, which exceeds the anticipated requirements for 2004 technology. However, other polymer composites having different volume percentages (i.e., a different dielectric constant) may be appropriate for other applications.

TABLE 3

| Gold Volume Percent | Dielectric Constant | Loss Factor |
| --- | --- | --- |
| 10.5 | 23 | 0.014 |
| 11 | 240 | 0.015 |
| 11.5 | 600 | 0.015 |
| 11.8 | 920 | 0.017 |
| 12 | 1600 | 0.042 |
| 12.2 | 2200 | 0.24 |
| 12.3 | 4 | 4.8 |
| 13 | 3.8 | 5.9 |
| 13.5 | 4 | 6.4 |

EXAMPLE 4

Table 4 illustrates the dielectric constant and loss factor of an exemplary embodiment of the polymer composite. The polymer composite includes carbon black (N660), as the conductive material having a particle diameter of about 70 nanometers, which can be purchased from Columbian Chemicals Company. The polymer composite includes an unmodified liquid epoxy resin (Epon™ 828) as the polymer resin, which can be purchased from the Shell Chemical Company. The polymer composite includes hexahydro-4-methylphthalic anhydride (HMPA) as the hardener, which can be purchased from the Aldrich Chemical Company. The polymer composite includes imidazole as the catalyst, which can be purchased from Shikoku Ltd. The polymer composite includes silicone polycarbonate urethane as the ceramic filler.

Initially, the catalyst, imidazole, is mixed with HMPA and then the unmodified liquid epoxy resin is added to the mixture. Subsequently, the ceramic filler is added to the mixture. Thereafter, the carbon black particles are added to the mixture and thoroughly mixed until a homogeneous mixture is formed. Then the homogeneous mixture is cured.

The unmodified liquid epoxy resin and HMPA are kept at a mixture ratio of about 1:0.85, respectively. The catalyst, imidazole, is kept between a level of about 0.1 to 1 parts per hundred parts of the total mixture. The ceramic filler is included in about 1 to about 15 volume percent of the polymer composite.

As shown in Table 4, the carbon black particle volume percent is varied between about 6% and 13.3% and specifically at the following volume percentages: 6%, 8%, 10%, and 13.3%. Table 4 lists the dielectric constant and loss factor of the polymer composite for each of the carbon black volume percentages listed above. The volume percents are selected to determine the approximate percolation threshold of this polymer composite. The polymer composite having a carbon black volume percentage of 10 achieves a dielectric constant of 990 while maintaining a loss factor of 1.41 (e.g., near the percolation threshold for the polymer composite). However, other polymer composites having different volume percents (i.e., a different dielectric constant and loss factor) may be used for other applications.

TABLE 4

| Carbon Black Volume Percent | Dielectric Constant | Loss Factor |
| --- | --- | --- |
| 6.0 | 220 | 0.22 |
| 8.0 | 450 | 0.33 |
| 10.0 | 990 | 1.41 |
| 13.3 | 1300 | 1.97 |

EXAMPLE 5

Table 5 illustrates the dielectric constant and loss factor of an exemplary embodiment of the polymer composite. The polymer composite includes aluminum, as the conductive material having a particle diameter of about 10.0 microns, which can be purchased from Alfa Aesar Company. The polymer composite includes unmodified liquid epoxy resin (Epon™ 828) as the polymer resin. The polymer composite includes methylhexahydrophthalic anhydride (MHHPA) as the hardener. The polymer composite includes 2-ethyl-4-methylimidazole (2E4MZ-CN) as the catalyst.

Initially, the catalyst, 2-ethyl-4-methylimidazole, is mixed with MHHPA and then the unmodified liquid epoxy resin is added to the mixture. Subsequently, the aluminum filler is added to the mixture. Thereafter, the aluminum particles are added to the mixture and thoroughly mixed until a homogeneous mixture is formed. Then the homogeneous mixture is cured.

The unmodified liquid epoxy resin and MHHPA are kept at a mixture ratio of about 1:0.85, respectively. The catalyst, 2-ethyl-4-methylimidazole, is kept between a level of about 0.1 to 1 parts per hundred parts of the total mixture.

As shown in Table 5, the aluminum particle volume percent is varied between about 40% and 70% and specifically at the following volume percentages: 40%, 50%, 60%, and 70%. Table 5 lists the dielectric constant and loss factor of the polymer composite for each of the aluminum volume percentages listed above.

TABLE 5

| Aluminum Volume Percent | Dielectric Constant | Loss Factor |
| --- | --- | --- |
| 40.0 | 5 | 0.03 |
| 50.0 | 18 | 0.02 |
| 60.0 | 25 | 0.032 |
| 70.0 | 40 | 0.021 |

It should be emphasized that the above-described embodiments of the present invention, particularly, any "preferred" embodiments, are merely possible examples of implementations, and are merely set forth for a clear understanding of the principles of the invention. Many variations and modifications may be made to the above-described embodiment(s) of the invention without departing substantially from the spirit and principles of the invention. All such Therefore, having thus described the invention, at least the following is claimed:

1. A polymer composite, comprising:
   a polymer resin; and
   a conductive material, wherein the polymer resin and the conductive material are combined in proportions to form the polymer composite characterized by a dielectric constant greater than 100.

2. The polymer composite of claim 1, wherein the polymer resin includes a thermoplastic polymer.

3. The polymer composite of claim 1, wherein the polymer resin includes a thermosetting polymer.

4. The polymer composite of claim 3, further including a hardener.

5. The polymer composite of claim 4, further including a material chosen from a catalyst, an adhesion promoter, a diluent, and a ceramic filler.

6. The polymer composite of claim 5, wherein the polymer includes between about 0 and about 10 volume percent catalyst, wherein the polymer includes between about 0.02 and about 10 volume percent adhesion promoter, wherein the polymer includes between about 0 and about 50 volume percent diluent, and wherein the polymer includes between about 0.1 and about 10 volume percent ceramic filler.

7. The polymer composite of claim 1, further including a material chosen from a catalyst, an adhesion promoter, a diluent, and a ceramic filler.

8. The polymer composite of claim 1, wherein the polymer resin is chosen from an epoxy, polyimide, siliconepolyimides, silicones, polyurethanes, and benzocyclobutenes.

9. The polymer composite of claim 1, wherein the polymer resin includes an epoxy.

10. The polymer composite of claim 1, wherein the conductive material is chosen from transition metals, alloys of transition metals, carbon black, carbon fiber, and graphite.

11. The polymer composite of claim 1, wherein the conductive material includes silver.

12. The polymer composite of claim 1, wherein the polymer composite includes between about 1 and 50 volume percent polymer resin.

13. The polymer composite of claim 1, wherein the polymer composite includes between about 5 and about 50 volume percent conductive material.

14. The polymer composite of claim 1, wherein the polymer composite includes conductive material having particle diameters between about 0.5 micrometers and about 50 micrometers.

15. The polymer composite of claim 1, wherein the polymer resin and the conductive material are combined in proportions to form the polymer composite that is characterized by a dielectric constant greater than 500.

16. The polymer composite of claim 1, wherein the polymer resin and the conductive material are combined in proportions to form the polymer composite that is characterized by a dielectric constant greater than 1000.

17. The polymer composite of claim 1, wherein the polymer resin and the conductive material are combined in proportions to form the polymer composite that is characterized by a dielectric constant greater than 1500.

18. The polymer composite of claim 1, wherein the polymer resin and the conductive material are combined in proportions to form the polymer composite that is characterized by a dielectric constant greater than 2000.

19. The polymer composite of claim 1, wherein the volume percent of the conductive material in the polymer composite is less than the volume percent associated with the percolation threshold of the polymer composite.

20. The polymer composite of claim 1, wherein the polymer composite is incorporated in a circuit board.

21. The polymer composite of claim 1, wherein the polymer composite is incorporated into a capacitor.

22. A method of making a polymer composite, comprising:
   providing a polymer resin and a conductive material; and
   mixing the polymer resin and the conductive material in proportions to form the polymer composite characterized by a dielectric constant greater than 100.

23. The method of claim 22, further comprising:
   providing materials chosen from a hardener, a catalyst, an adhesion promoter, a diluent, and a ceramic filler; and
   mixing the polymer resin and the conductive material with at least one of the materials chosen from a hardener, a catalyst, an adhesion promoter, a diluent, and a ceramic filler.

24. The method of claim 22, further comprising curing the polymer resin and conductive material mixture.

25. The polymer composite of claim 4, wherein the hardener is chosen from anhydrides, amines, carboxylic acid anhydrides, thiols, alcohols, phenols, isocyanates, boron complexes, inorganic acids, hydrazides, imidazoles, derivatives thereof, and combinations thereof.

26. The polymer composite of claim 4, wherein the hardener includes an anhydride.

27. The polymer composite of claim 4, wherein the polymer composite includes between about 1 and 50 volume percent hardener.

* * * * *